United States Patent
Pecen

(10) Patent No.: US 6,603,825 B1
(45) Date of Patent: Aug. 5, 2003

(54) AUTOMATIC GAIN CONTROL FOR A RECEIVER AND METHOD THEREFOR

(75) Inventor: Mark Edward Pecen, Rolling Meadows, IL (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/229,144

(22) Filed: Jan. 12, 1999

(51) Int. Cl.⁷ .............................................. H04L 27/08
(52) U.S. Cl. ...................................................... 375/345
(58) Field of Search ....................... 375/345; 455/232.1, 455/245.1, 240.1, 239.1, 250.1, 279, 220

(56) References Cited

U.S. PATENT DOCUMENTS

| | | | |
|---|---|---|---|
| 5,083,304 A | | 1/1992 | Cahill .......................... 375/345 |
| 5,204,977 A | | 4/1993 | Feldt ......................... 455/234.2 |
| 5,331,638 A | * | 7/1994 | Honkasalo et al. .......... 370/347 |
| 5,758,271 A | * | 5/1998 | Rich et al. ................ 455/234.1 |
| 5,907,798 A | * | 5/1999 | Abramsky et al. ........ 455/249.1 |
| 5,930,692 A | * | 7/1999 | Peterzell et al. ............ 455/217 |

\* cited by examiner

*Primary Examiner*—Mohammad H. Ghayour
(74) *Attorney, Agent, or Firm*—Randall S. Vaas; Roland K. Bowler, II; Lawrence J. Chapa

(57) ABSTRACT

A receiver automatic gain control includes a variable gain receiver having a control input and responsive to a gain control signal for adjusting the output level of the receiver. A controller is coupled to the variable gain receiver. The controller monitors a received signal quality and a received signal power level. The controller generates a control signal for controlling the gain of the variable gain receiver as a function of the signal quality and the power level. The controller controls the gain as function of the received signal power level and selectively controls the gain as a function of the signal quality.

6 Claims, 5 Drawing Sheets

AUTOMATIC GAIN CONTROL FOR A RECEIVER AND METHOD THEREFOR

FIELD OF THE INVENTION

The present invention pertains to automatic gain controls, and more particularly to automatic gain control for a receiver, and to allocation of a channel.

BACKGROUND OF THE INVENTION

A variety of devices are known that include transceivers used in communications with other compatible devices. Examples of such devices include wireless communication devices such as radio telephones, which may be cordless or cellular, two-way radios, base stations, pagers, and wire line or cable communication devices such as modems, data terminals, or the like. These devices typically include a circuitry to control the transmit and receive path gain such that receive signals are output at a somewhat uniform signal level.

Wireless communication systems are particularly difficult to provide power control as the environment is by its nature very dynamic. The distance between a mobile devices, or a mobile device and a base station, is subject to constant change. Additionally, the transmission path may change as obstructions move into the transmission path between the mobile device an another device. For example, buildings, hills, and other obstructions move in and out of the transmission path of a cellular radiotelephone as it moves. These obstructions will negatively impact on the level of the signal received by the bast station and the mobile device during a communication exchange.

Accordingly, systems such as the Global System for Mobile Communications (GSM, require radio frequency (RF) power control. The objective of such power control is to achieve the minimum amount of power needed for adequate wireless communication quality. By limiting the level of signals communicated, the average amount of RF spectral energy detected by surrounding mobiles and base stations is reduced. This has the effect of reducing interference, as the level of interference on an RF channel is the sum of the contributions from all of RF sources.

The purpose of the RF power control is therefor to reduce the amount of channel interference present on each channel. This increases the link reliability and the capacity of the channels.

For example, the GSM standard for circuit switched voice telephony specifies that the range over which the base station subsystem (BSS) RF power is to be controlled extends from the station's maximum to 30 dB below the maximum. The standard specifies similar requirements for the mobile station, depending upon the power output class of the mobile.

However, for General Packet Radio Service (GPRS), power control is significantly more difficult to achieve. This is due to the variant length of data packets and variations in the time period between transmission of data packets between the base station and the mobile station in GPRS mode.

The method of control specified for transmissions from the base station to the mobile station in the GSM GPRS example requires that the BTS must transmit the four bursts which comprise a single data block at the same power level. However, this standard also permits control of the base transceiver station (BTS) on a block-by-block basis based on Channel Quality Reports.

The extent of power control on the transmission of data blocks under this exemplary standard can extend from the value of the output power transmitted by the base transceiver station on the broadcast control channel (BCCH) to a level 30 dB below the BCCH carrier. Additionally, a GPRS mobile may be required to receive down link data blocks on more than one time slot. For example, the amplitude of two four-burst intervals which comprise a block of data may differ.

These factors combine to present difficulties in implementing an effective AGC function for mobile stations. One proposal that has been made is to provide data in one transmission that indicates the attenuation amount, relative to the RF power level of the BCCH carrier, at which the next base transceiver station data block will be transmitted.

However, their are problems associated with accepting this type of information. For example, it is difficult to achieve initial acquisition of automatic gain control (AGC). There are problems associated with processing actions to set the AGC level in the absence of a decodable signal, such as intermittent decode errors distributed over a down link transfer. Additional problems will occur when attempting to decode data in more that one time slot. Most problematic however, is accommodating dynamic time slot allocation for mobile transmissions, where the mobile is required to monitor all time slots, some of which may be addressed to other mobiles, in order to receive an assignment of which up link time slot on which it is to transmit.

Accordingly, there is need for an improved method of providing automatic gain control in a receiver for a dynamic system.

DETAILED DESCRIPTION OF THE DRAWINGS

A receiver automatic gain control includes a variable gain receiver having a control input and responsive to a gain control signal for adjusting the output level of the receiver. A controller coupled to the variable gain receiver. The controller monitors a received signal quality and a received signal power level. The controller controls the gain of the variable gain receiver as a function of the signal quality and the carrier power level. The controller selectively controls the gain as function of the received signal power level and received signal quality. The gain control insures operation in the linear portion of the receiver amplifiers. Consequently a properly decodable signal is produced by the receiver for data blocks directed to the remote receiver.

Figure 1:
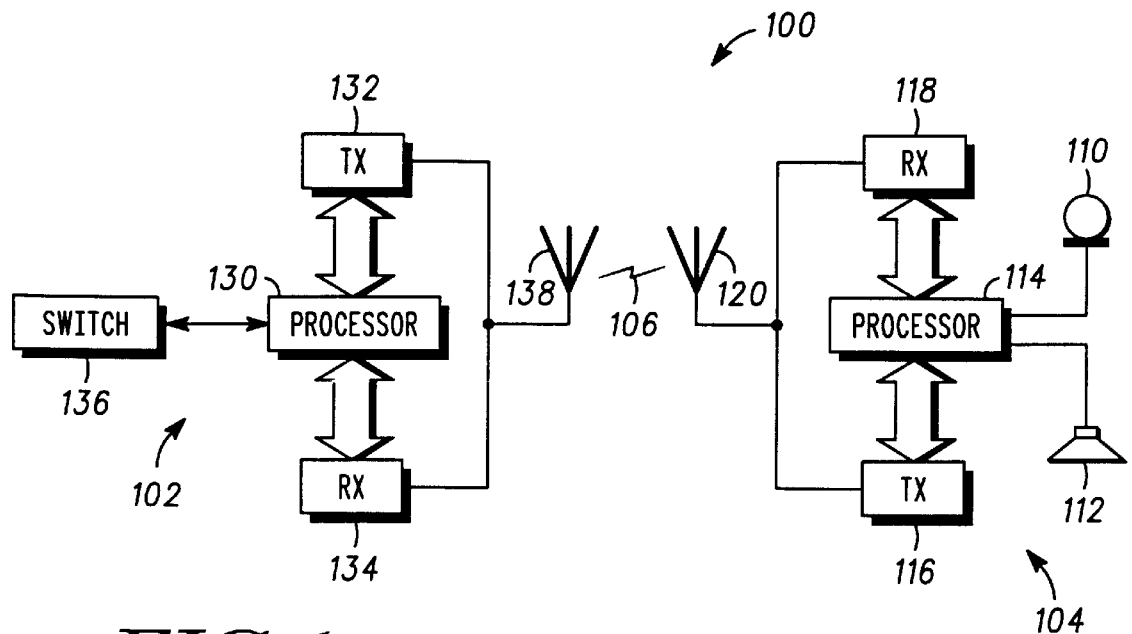
FIG. 1. is a circuit schematic in block diagram form illustrating a communication system.

A communication system 100 (FIG. 1) includes a local transceiver 102 and a remote transceiver 104 connected by a communication link 106. The local transceiver 102 can be in any communication device such as a modem, a base station, a data terminal, or the like. The remote transceiver 104 can be in any communication device such as a portable telephone, a modem, a satellite telephone, a data terminal or the like. The communication link 106 can be a wire line, a cable, a wireless air link, or any other transmission medium.

The illustrated remote transceiver 104 includes a microphone 110 and a speaker 112 coupled to a processor 114. The transceiver 104 includes a transmitter 116 and a receiver 118 connected to an antenna 120. The remote transceiver is coupled to a transmitter 132, a receiver 134, and a switch 136. The "switch" can be any communication device such as a router, a switch or a signal source which communicates signals to and from the processor 130. The transmitter 132 and the receiver 134 are connected to an antenna 138.

Figure 2:
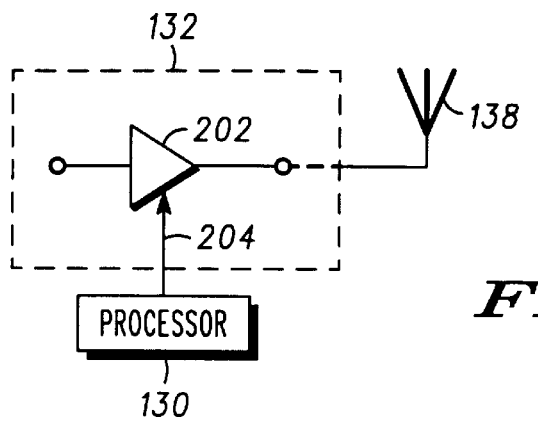
FIG. 2. is a circuit schematic in block diagram form illustrating a transmitter and processor.

The illustrated local transceiver 102 transmitter 132 includes a variable gain amplifier 202 (FIG. 2) controlled by processor 130. The amplifier 202 is responsive to control signals 204 from processor 130 to control the amplitude of the signal emitted from local transceiver 102 for communication to the remote transceiver 104. The remote transceiver 104 receiver 118 operates under the control of a processor 114. The processors, or controllers 114, 130, can each be implemented using a digital signal processor (DSP), a microprocessor, a microcontroller, a programmable logic unit (PLU), logic circuitry, or a combination thereof.

Figure 3:
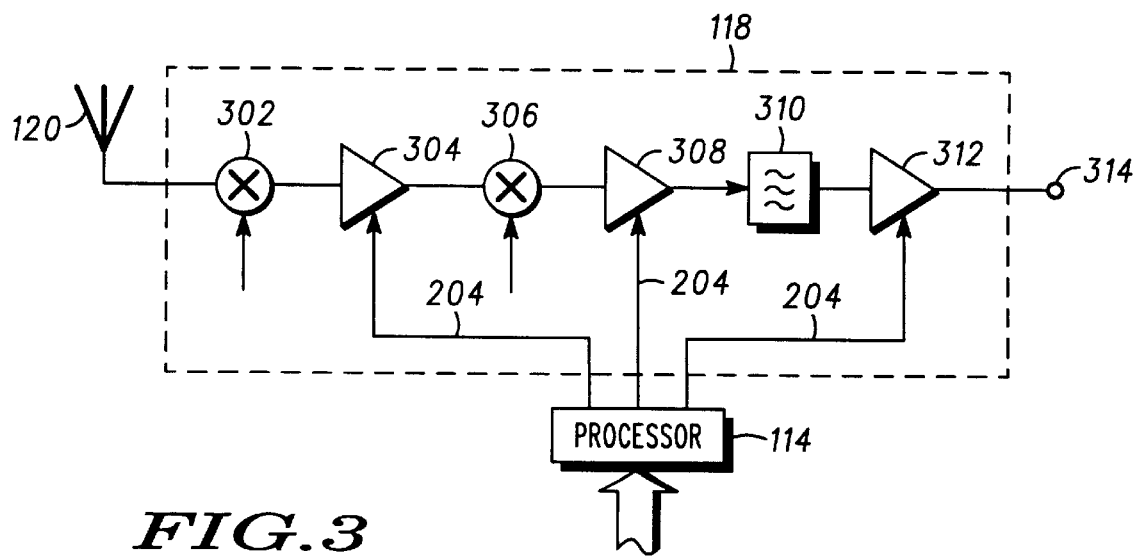
FIG. 3. is a circuit schematic in block diagram form illustrating a receiver and processor.

The remote receiver 118 includes a mixer 302 (FIG. 3), a variable gain amplifier 304, a mixer 306, a variable gain amplifier 308, a filter 310, and a variable gain amplifier 312. The mixers 302 and 304 are provided to demodulate and step down the desired carrier signal frequency (for example, the communication channel in a cellular system, down to an intermediate frequency). The variable gain amplifiers 304, 308 and 312 are responsive to gain control signals 204 from processor 114 to control the gain of the received signal, such that the signal output at 314 is at a desired amplitude to insure linear operation of amplifies in the transceiver processing the received signal. The filter 310 removes signals outside of the desired received signal frequency band.

The system automatic gain control operates by the local transceiver 102 first determining where to set the transmitter 132 power level for the packet data channel (PDCH) relative to the broadcast carrier channel (BCCH). The decision is made in processor 130 based upon a signal quality measurement received from the remote station 104 and the received carrier power BCCH carrier reported by the remote transceiver 104 back to the local transceiver 102.

In particular there is a certain power level at which increases in the local station 102 transmit power will not produce increases in the remote transceiver 104 received signal quality. This is because all of the data being transmitted is accurately demodulated and recovered by the remote receiver 118 at the transmitter 132 transmission power.

Processor 130 determines how much lower the local transceiver 132 transmission power can be reduced before appreciable degradation occurs in the received signal quality measured at receiver 118 by processor 114. This determination is made based upon a signal quality measurement made by the transceiver 104 processor 114, which signal quality measurement can for example be the bit error rate measured by the remote receiver. The bit error rate indicates whether the data received by receiver 118 is being decoded accurately. If it is, then the gain of transceiver 132 can be lowered until the bit error rates falls off. The critical threshold occurs when reductions in the transmit power produce increases in the bit error rate reported by the remote transceiver 104 back to the local transceiver 102. Based upon these criteria, the local transceiver may set its transmission power level for data packets sent on the DPCH.

The remote station 104 receiver 118 provides additional automatic gain control when the transmitter 132 can no longer reduce its gain, but the receiver is outputting a signal above the optimum threshold at which additional gain will not result in increases in the performance of the transceiver 104. This receiver automatic gain control is provide to insure that the received signal level output by at 314 is not so large that receiver amplifiers (shown and not shown) are not operating in their linear range, thereby causing distortion of the receive data resulting in bit errors. The receiver automatic gain control uses measurements of the receive signal quality, for example by monitoring the bit error rate and the magnitude of received carrier signal or another signal indicative of the interference level for the communication link 106. These measurements can advantageously be the same measurements communicated back the local transceiver as described above.

In particular, if the reported ratio of the carrier signal power to the bit error rate measurement is less than or equal to an optimal threshold level (the level at which increase in the power level do not produce an increase in signal quality as measured by the remote transceiver 104) additional power control is not applied at the receiver. If however, if the ratio of the carrier signal to the bit error rate is above the optimal threshold level then the receiver gain is attenuated up to its maximum attenuation level, for example in steps.

It is further envisioned that the remote receiver 118 can track the value of a BCCH carrier broadcast by the local site. The BCCH carrier is continuously transmitted signal having a predetermined fixed level when it is transmitted by the local transceiver 102. Because of the fixed transmission level, the magnitude of the BCCH carrier when it is received at the remote transceiver 104 is indicative of the communication channel signal loss. By setting the gain of the receiver inversely to the magnitude of received carrier signal, the gain of the receiver is increased when the remote transceiver is receiving a weaker signal.

If the reported signal quality measured at remote transceiver 104 is greater than the optimum threshold level and the difference between the optimal and reported signal level is less than or equal to the maximum amount of power reduction that the local transmitter 132 can apply to the transmission, then power control is applied at the remote receiver 104 to maintain the threshold power level output by the receiver gain controls 304, 308, 312, under the control of processor 114.

A gain control system can thus employ both local transceiver 102 and remote transceiver 104 gain control. The automatic gain control tracks the value of the BCCH carrier level from the local transceiver. If the reported C to I signal measurement is greater than the optimal signal level, and the difference between the optimal and reported signal quality measurement is greater than the maximum amount of power reduction a base station can apply to a down link transmission, then the power control is applied at the receiver 118. The automatic gain control (AGC) in the receiver will thereafter track the value of the BCCH carrier level of the local transmitter to provide automatic gain control in the receiver.

The carrier signal is measured by detecting at the remote receiver 104 the wanted carrier signal level broadcast from the desired local transceiver 134. It is envisioned that the wanted carrier signal will be coded such that it is identifiable. In this manner, the remote transceiver can identify and measure the carrier signal from the desired source.

Figure 4:
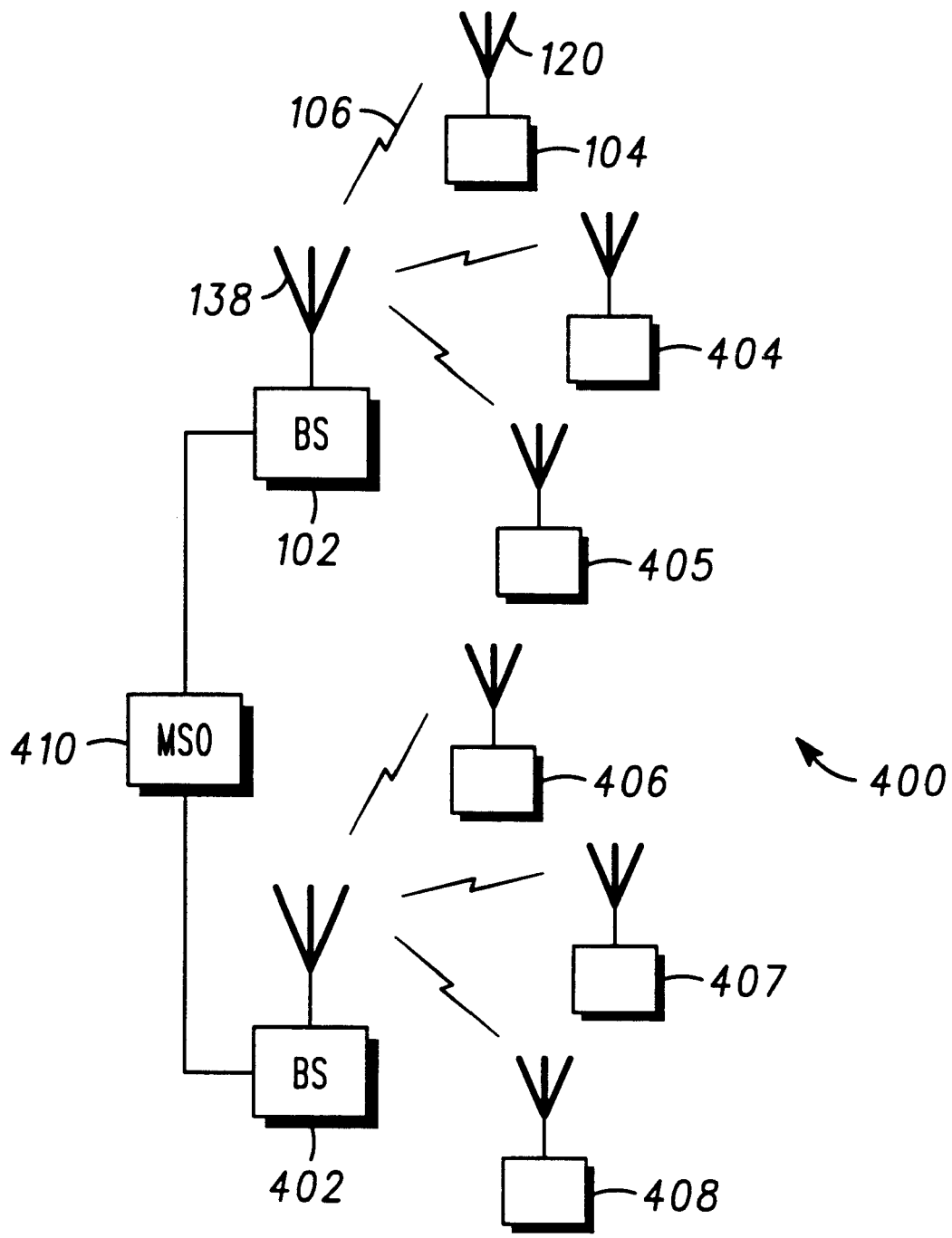
FIG. 4. is schematic illustrating a mobile radiotelephone system.

Interference can result form a variety of different sources. A cellular system 400 is illustrated in FIG. 4. The local tranceiver 102 is in a base station. The remote transceiver 104 is in a portable radiotelephone. The interference can result from transmissions from base stations 402 other than the wanted local transceiver. In a time division system, interference can be caused by transmissions for other portable cellular telephones 404–408 communicating at the same frequency, but in other time slots. Interference can also result form other devices operating at other frequencies.

It is envisioned that interference can be measured by bit error rate. The GSM system, for example, is known to use an interference measurement for mobile assisted hand-off known as the C to I ratio. This ratio is a measurement of the carrier to interference.

Figure 5:
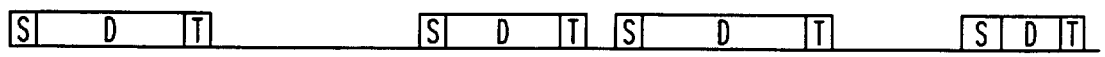
FIG. 5. is a schematic representing GPRS data.

The GPRS data transfer characteristics for the GSM system make automatic gain control particularly problematic. The transfer of data is provided by packet switching. Instead of a dedicated time slot, each transfer of data from the local transceiver to the remote transceiver is accomplished using packets having a setup sequence, data, and a tear down sequence, as represented in FIG. 5. The length of the time periods between data packets can be used for servicing other remote devices operating on the same carrier frequency. In this GPRS system, there is no guarantee that a signal will be provided for the cellular radiotelephone, represented by remote transceiver 104, at any particular time.

Figure 6:
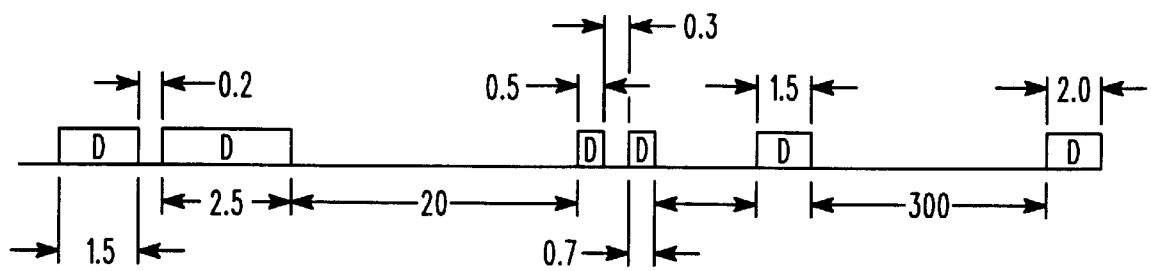
FIG. 6. is a schematic representing a data transfer sequence.

The GPRS data transmission is illustrated in FIG. 6. The time period between packets are separated by intervals that may be milliseconds or hours apart, depending upon the data transfer demands of the mobile application or another mobile's needs. Additionally, the periods for each transmission (labeled "D") are not uniform, although the setup and tear down for each packet will be substantially uniform. This makes it difficult to set the gain of the local receiver in time to receive and decode the data component of the packets.

Figure 7:
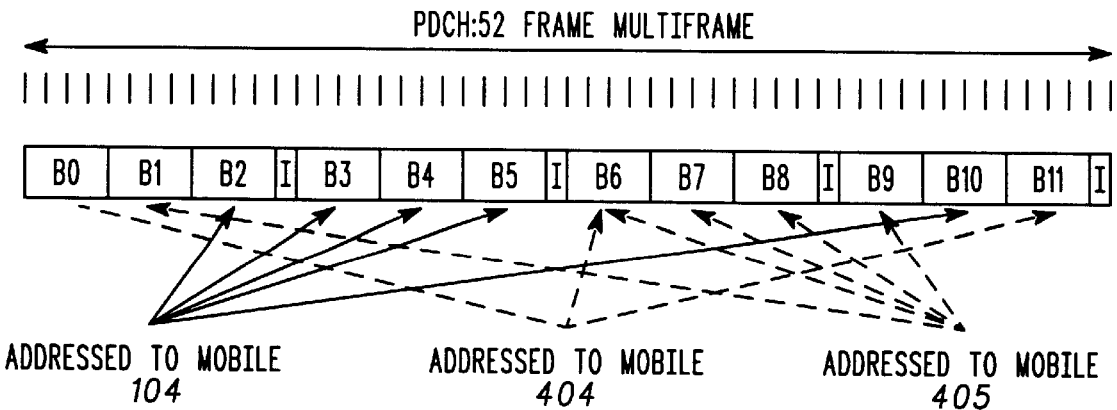
FIG. 7. is a schematic representing multiple mobile data frame allocation.

In FIG. 7, the frame allocation to the mobiles (radiotelephones) 104, 404, 405 is illustrated. In GPRS, there are times when the mobile radiotelephones 104, 404, 405 may be required to listen to all down link data blocks to decode the address fields, which is the method by which a mobile determines if a data block was intended for it.

The primary purpose of power control is to reduce the amount of average RF energy radiated around the antenna 138 of a base station incorporating local transceiver 102, thereby reducing the amount of co-channel interference to mobiles 104, 404 and 405 sharing the same channel. The lower the co-channel interference from the perspective of a set of mobile radiotelephones, the greater the number of mobile radiotelephones a base station may serve in an environment such as a cellular environment where down link power control is used on sever co-channel base station sites.

The more that the base stations down link power levels are reduced, the lower the co-channel interference to mobiles 104, 404, 405 on the fringe areas of the cells covered by other base stations. Base stations reduce their down link power level to mobiles based upon how the mobile stations are receiving the base station signals as determined form the mobile station signal quality measurement discussed above.

The longer the communication link 106 between a base station local tranceiver 102 and a mobile remote station 104, the more the attenuation of the signal along the path 106. As is known, the closer the mobile remote station 104 is to the base station local transceiver 102 the more the base station will apply power control, thereby reducing the amount of power delivered to the mobile remote transceiver 102 and other radiotelephones.

Figure 8:
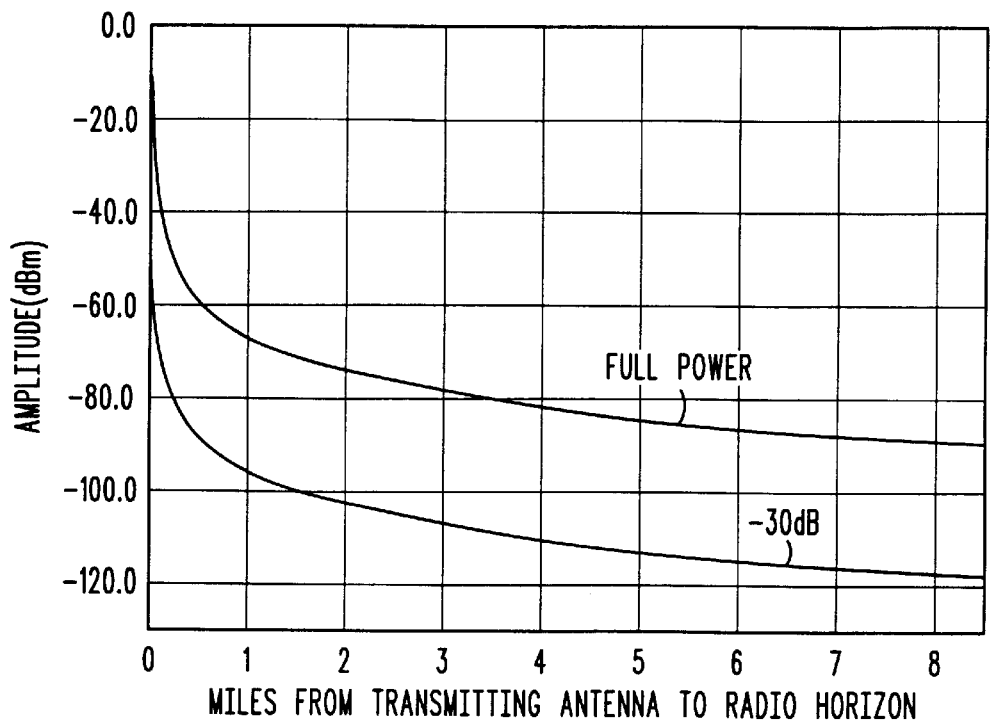
FIG. 8. illustrates mobile receive amplitude as a function of distance.

The plot for power control for a mobile in a somewhat dense environment, such as an urban cellular environment, is illustrated in FIG. 8. The top curve represents the level of the desired signal received by the mobile remote transceiver 104 if the base station local transceiver 102 transmits at full power. The power level decreases as the distance increases. The lower curve represents the signal level of the wanted signal received by the mobile remote transceiver 104 with the local tranceiver 102 transmitting at its maximum attenuation level.

Figure 9:
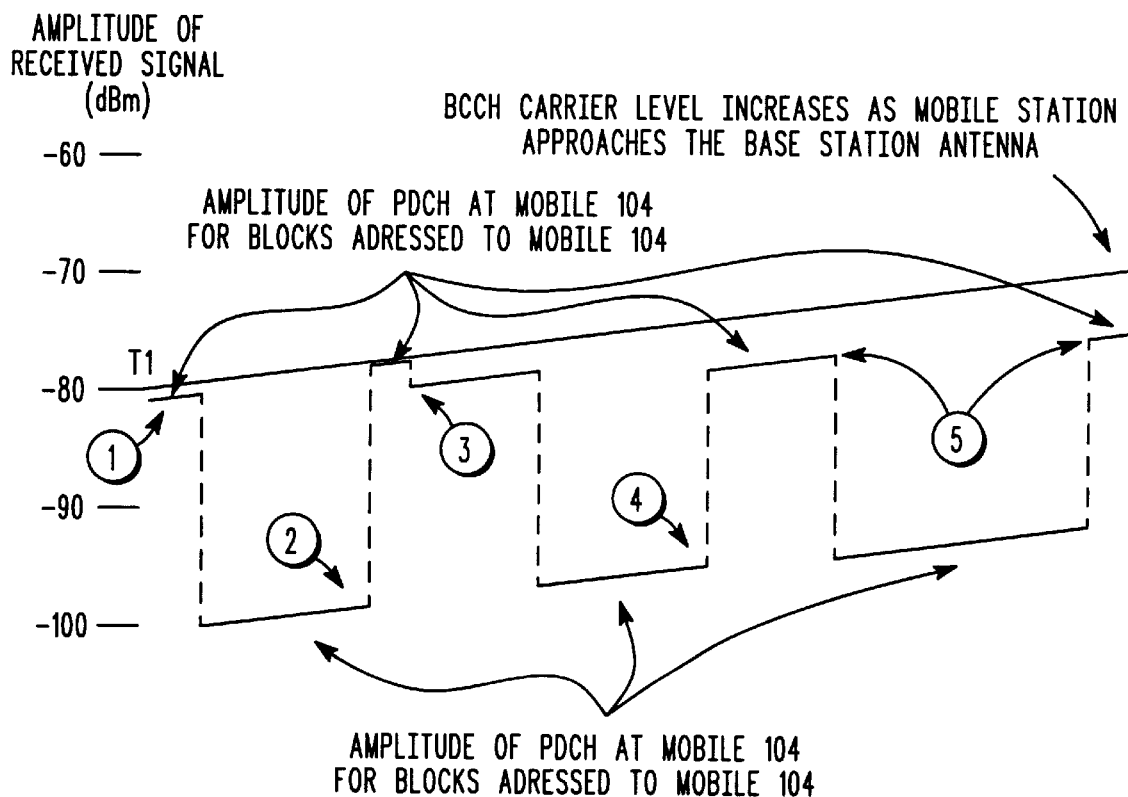
FIG. 9. illustrates data packets.

The signal received by mobile remote transceiver 104 when the base station local transceiver 102 has power control is illustrated in FIG. 9. Because the BCCH carrier is transmitted at a constant amplitude, the level of the BCCH detected by a mobile will increase as the mobile moves closer to the base station. Prior to point T1, the PDCH carrier level sent is identical to the BCCH carrier. Power control at the mobile is not used at this point as the received signal level is at the threshold level wherein decreases in the signal level result in a degradation of the C to I ratio to an unacceptable level. The C to I level measurement was communicated in the interference report to the base station as a bit error rate indication and the received carrier signal level.

During interval 2, the base station communicates data on the PDCH to another mobile 404 which is closer to antenna 138. In interval 3, the local transceiver 102 transmitter 132 attenuates the PDCH transmitted to mobile remote transceiver 104 as the C to I ratio will tolerate a lower transmission level without effecting data decoding. The power level of the PDCH is thus reduced using transmitter variable gain control 202 such that the signal received is at an acceptable quality level. During interval 4, the base station transmits to the mobile radiotelephone 404. During subsequent intervals 5, the base transmits to the mobile remote transceiver 104 with additional attenuation.

An additional algorithm is provided to significantly improve performance of the system. The additional algorithm is AGC performed in the mobile remote transceiver 104 receiver 118. The receiver 118 uses the carrier to interference ratio used to set the local station transmitter 132 gain to set the receiver gain periodically, which helps ensure operation of the receiver amplifiers in the linear region of its transfer curve. This in turn ensures proper decoding of the demodulated data intended for the mobile remote transceiver 104 .

The GSM GPRS specification for example requires that the radiotelephones 104, 404, 405 take signal measurements repeatedly and communicate this information to the base station. In particular, it is envisioned that the base station will reduce the down link carrier power on the PCDH relative to the BCCH carrier power if the ration of the carrier signal to the bite error rate reported by the mobile to the base station is sufficient to support such power control. Additionally, it is envisioned that if the received BCCH carrier level reported by the mobile to the base station is above a certain threshold at which reducing the transmitted power would still result in a properly decoded signal at the mobile.

Power control at the receiver will now be described with respect to the following:

C is a measurement of the BCCH carrier,

I is a measurement of the interference which is preferably the bit error rate of the received data;

Vb is of the value of the received BCCH carrier;

Co is the value of C to I ratio when optimal;

Cr is the actual measured C to I ratio that the remote transceiver reported;

Rm is the maximum permissible value of down link power reduction that the local transceiver can apply (e.g., 30 dB in transmitter 132);

Copt, indicates that the reported C to I ratio is optimal;

Cm indicates that the C to I ratio is maximum (it is at a point over which increasing received signal power results in no achievable benefit);

P is the level of power control applied by the local transceiver 102; and

Pm indicates that the power control is applied at maximum permissible level (Vb—Rm)

Power control is provided as follows:

If Cr is less than Co, then C to I is not optimal and power control is not applied at the receiver 118 herein, and the AGC tracks the value of the BCCH carrier level associated with the local transceiver 102.

If Cr is greater than Co, and Cr—Co is less than Rm, then power control is applied at the remote transceiver receiver 118 to maintain Co such that the AGC in the receiver tracks the value of Vb—(Cr—Co).

If Cr is greater than Co, and (Cr—Co) is greater than Rm, power control at the receiver is applied at the maximum allowable degree, and such that the AGC function tracks the BCCH carrier level of the serving cell minus the maximum allowable power level of the power control in the receiver.

Figure 10:
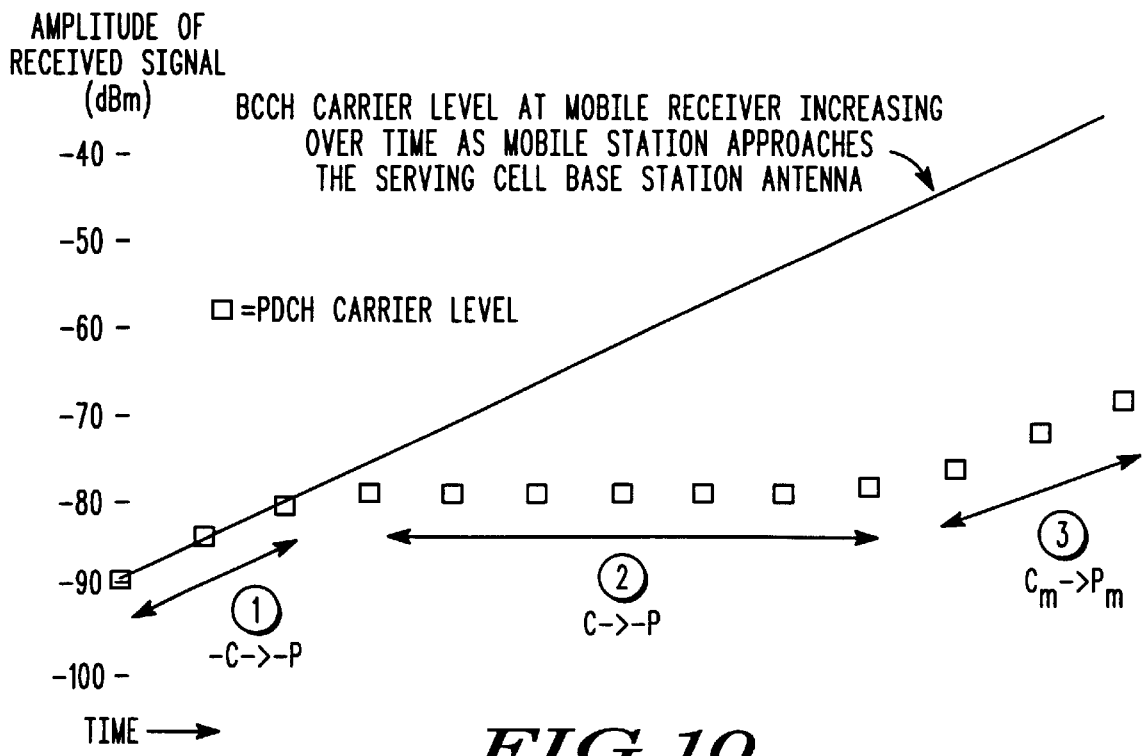
FIG. 10. represents a PDCH carrier relative to a BCCH carrier.
Figure 11:
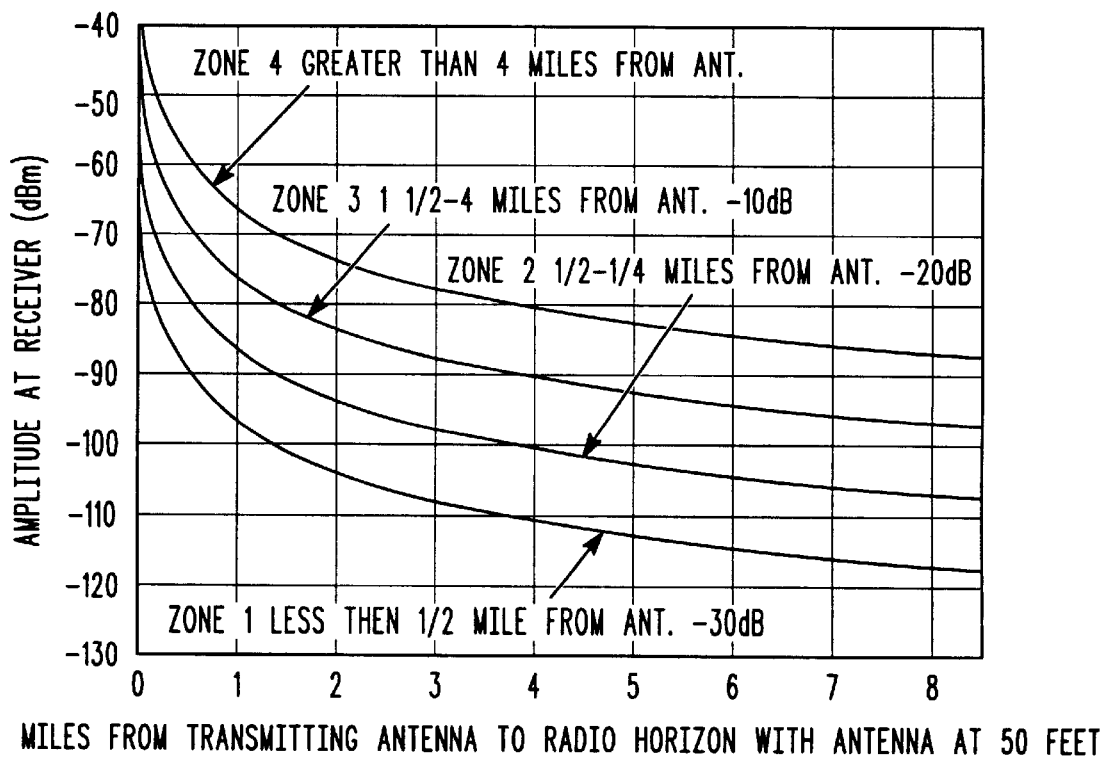
FIG. 11 represents a zoned channel allocation for a base station.

As the mobile station approaches the base station with time going across the base of FIG. 10, the BCCH carrier level increases. The PDCH and BCCH carrier levels are equal (in region 1) until the signal quality as determined by the ratio of the C to I ratio as reported and the BCCH carrier level are sufficient to warrant power control on the down link PDCH. The power level of the PDCH is reduced in the transmitter to the mobile station to maintain optimal C to I ratio with minimum transmitted power level, thus minimizing interference and maximizing cell occupancy.

Once the mobile is so near the base station transmitting antenna that the maximum range of power control has been reached, the PDCH carrier level will be equal to the BCCH carrier level minus 30 dB (represented by region 3). At this point in the operation of the system, the signal level of the receiver may cause the receiver operate in the non-linear region. IT is at this point that the receiver automatic gain control provides additional attenuation in the receiver to remove this distortion.

It is further envisioned that dynamic allocation of channels be provided in the base station associated with local transceiver 104 such that mobiles having a common distance (signal path loss) are on a common channel. Thus mobiles would be placed on a channel based upon their distance from antenna 138. In particular, the mobiles in the cell of a base station will be allocated to respective zones of the cell. All mobiles in the same zone, and thus at similar distances, are placed on a common channel. This permits additional improvement in performance of the system.

In particular, the base local transceiver servicing a plurality of remote devices 104, 404, 405 can group radiotelephones at common distances into common zones. FIG. 10 shows zones 1, 2, 3, and 4. A first channel will be allocated to those mobiles sharing zone 1. The power control provided to packets transmitted to the radiotelephones in zone 1 can thus be at similar levels. This facilitates the ability of the base station to provide a signal to all of the mobiles in its zone with a comparable base station attenuation, reducing the amount of change required for transmissions to different mobiles and permitting servicing of more mobiles in zones having better performance, and providing reduced co-channel interference.

Accordingly it can be seen that an improved gain control system is disclosed. The system provides significant improvement in the systems such as cellular systems, where gain control for packet transmissions is particularly challenging.

What is claimed:

1. A method for automatic gain control comprising:

measuring a broadcast control channel (BCCH) carrier signal level, a traffic channel (TCH) signal level, a BCCH carrier to interference ratio and a TCH carrier to interference ratio; and adjusting a receiver gain of a receiver that receives information on a TCH, in response to said BCCH carrier signal level, and said BCCH carrier to interference ratio reaching a first predetermined value and said TCH carrier to interference ratio reaching a second predetermined value.

2. The method of claim 1, further comprising:

receiving information on said TCH at said receiver at said adjusted receiver gain.

3. The method of claim 2, further comprising:

adjusting said receiver gain based on said measured BCCH carrier signal level, BCCH carrier to interference ratio and said determined mathematical and logical relationship in the absence of a signal transmitted on said TCH, as a predictor of said receiver gain in anticipation of a next transmitted signal on said TCH.

4. A method for automatic gain control comprising:

measuring a broadcast control channel (BCCH) carrier signal level and a traffic channel (TCH) signal level;

determining a BCCH carrier to interference ratio and a TCH carrier to interference ratio;

determining a mathematical and logical relationship between said measured BCCH carrier signal level, said BCCH carrier to interference ratio level, said TCH signal level and said TCH carrier to interference ratio;

setting a receiver gain based on said measured BCCH carrier signal level, BCCH carrier to interference ratio and said determined mathematical and logical relationship in the absence of any signal transmitted on the traffic channel, as a predictor of said gain setting in anticipation of the next transmitted signal On the traffic channel; and determining a mathematical and logical relationship such that if said measured BCCH carrier to interference ratio is less than a threshold BCCH carrier to interference ratio, then said determined BCCH carrier to Interference signal ratio is not optimal and the receiver assumes that the transmitter does not apply power control, and said receiver gain setting in the receiver tracks the value of the BCCH carrier level associated with the local transceiver.

5. The method of claim 4, further comprising:

determining that said determined BCCH carrier to interference ratio is greater than a threshold BCCH carrier to interference ratio, and said determined BCCH carrier to interference ratio (Cr)—minus said threshold BCCH carrier to interference ratio (Co) is less than a maximum permissive downlink power reduction (Rm); and setting a receiver gain then power control is applied at the remote transceiver receiver to maintain said threshold BCCH carrier to interference ratio (Co) such that said receiver gain setting in the receiver tracks the value of said measured BCCH carrier signal level minus the difference between said determined BCCH carrier to interference ratio and said threshold BCCH carrier to interference ratio Vb—(Cr—Co).

6. The method of claim 4, further comprising:

determining that said determined BCCH carrier to interference ratio is greater than a threshold BCCH carrier to interference ratio, and said determined BCCH carrier to interference ratio minus said threshold BCCH carrier to interference ratio (Co) is greater than a maximum permissive downlink power reduction (RM); and setting said receiver gain at a maximum allowable degree, and such that said receiver gain tracks said measured BCCH carrier level minus the maximum allowable power level of the power control in the receiver.

* * * * *